(12) United States Patent
Kivilahti

(10) Patent No.: US 6,193,139 B1
(45) Date of Patent: Feb. 27, 2001

(54) METHOD FOR JOINING METALS BY SOLDERING

(76) Inventor: Jorma Kivilahti, Kuhatie 11 B 6, FIN-02170 Espoo (FI)

( * ) Notice: Subject to any disclaimer, the term of this patent is extended or adjusted under 35 U.S.C. 154(b) by 0 days.

(21) Appl. No.: 09/137,724

(22) Filed: Aug. 21, 1998

Related U.S. Application Data

(62) Division of application No. 08/733,665, filed on Oct. 17, 1996, now Pat. No. 6,015,082.

(51) Int. Cl.⁷ ............................... B23K 1/00; H05K 3/34
(52) U.S. Cl. ...................... 228/180.21; 228/253; 228/254
(58) Field of Search .................................... 228/135, 177, 228/179.1, 180.21, 180.22, 253, 254

(56) References Cited

U.S. PATENT DOCUMENTS

| | | | | |
|---|---|---|---|---|
| 4,012,832 | * | 3/1977 | Crane | 438/4 |
| 4,098,452 | | 7/1978 | Webster et al. | 228/123 |
| 4,735,847 | * | 4/1988 | Fujiwara et al. | 428/209 |
| 5,609,315 | * | 3/1997 | Lepore, Jr. | 244/163 |
| 5,751,061 | * | 5/1998 | Mays et al. | 257/707 |
| 5,838,067 | * | 11/1998 | Baek | 257/737 |
| 5,912,377 | * | 6/1999 | Hall et al. | 556/415 |

FOREIGN PATENT DOCUMENTS

| | | | | |
|---|---|---|---|---|
| 148193 | * | 5/1981 | (DD) | B23K/35/362 |
| 1005346 | * | 3/1957 | (DE) | B23K/1/20 |
| 1239178 | * | 4/1967 | (DE) | B23K/1/20 |
| 0147856 A3 | * | 7/1985 | (EP) | H01R/4/04 |
| 0265077 A3 | * | 4/1988 | (EP) | H01L/23/48 |
| 0365807 A1 | * | 5/1990 | (EP) | B23K/35/26 |
| 0532015 A3 | * | 3/1993 | (EP) | H01L/21/603 |
| 0576872 A1 | * | 1/1994 | (EP) | B23K/35/00 |
| 2479055 | * | 10/1981 | (FR) | B23K/1/20 |

* cited by examiner

Primary Examiner—Samuel M. Heinrich
(74) Attorney, Agent, or Firm—Wolf, Greenfield & Sacks, P.C.

(57) ABSTRACT

The invention relates to a method for joining coated metallic conductors and the application of the method to production of very high density microjoints as well as to the fabrication of macrojoints. It is characteristic for the invention that the surfaces to be connected are coated with solder metal or solder alloy layers, one on the top of the other. The mating contact areas are heated for a short period of time over the temperature where the base coatings and the top coatings fuse transiently. It is essential that the base coating and the top coating cannot produce intermetallic compounds with each other and that the contact interface between them is as metallic as possible. This kind of contact can be obtained for example by chemical or electrochemical deposition. Moreover, when the topcoat is capable of protecting the base coating, for example bismuth, the joining can be performed under normal atmosphere and without any flux. The method can be applied equally well either to the manufacturing of high density microjoints or to the joining of relatively large contact areas, which reduces the number of process steps in electronics assembly. A thin polymer film can be placed between the contact pads of components and substrate metallisations containing solder particles which are compatible with the base coatings of the contact areas. When the contact area is heated under external pressure, local microjoints are formed due to the fact that the solder particles and the base coating fuse transiently. Polymer film enhances the formation of the local microjoints, and protects the solder joints from external oxygen and moisture. The joining method of the present invention is easy to use. It does not imply the application of flux, and thus the joints need no cleaning. Furthermore, since the method is lead-free, it is environmental-friendly also from that point of view.

6 Claims, 2 Drawing Sheets

METHOD FOR JOINING METALS BY SOLDERING

Figure 1A:
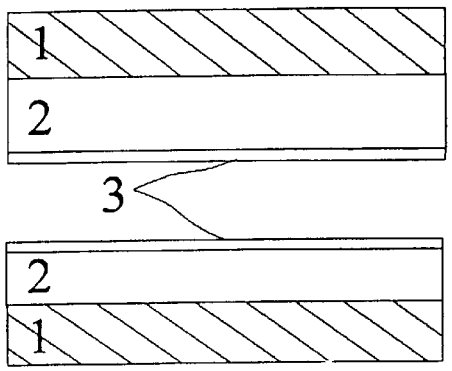

This application is a divisional of application Ser. No. 08/733,655, filed Oct. 17, 1996, now U.S. Pat. No. 6,015,082, entitled METHOD FOR JOINING METALS BY SOLDERING, and now pending.

The invention relates to a method for joining electrically conductive metal-coated electrodes and to the application of the method to the production of microjoints in electronics industry.

Design and manufacturing of electronic components and their high density assemblies are developed intensively, so that the performance of functionally more advanced devices can be produced more reliably and cost-effectively. In particular, increasing usage of consumer electronics and portable telecommunication devices is enforcing electronics industry to research and develop microjoining technologies and substrate materials.

Since ever lighter and smaller electronic components and devices should have more functions, the number of the (I/O)-contacts of microcircuits is increasing continuously. Concurrently, the number of microjoints between integrated circuits and the contact areas of the substrates is growing remarkably. Consequently, the interdistances between the contact areas are reducing, which makes the microjoining more difficult. Furthermore, problems are produced by the increasing number of passive components of various sizes on printed circuit boards, the alignment of smaller contacts areas between integrated circuits and substrates as well as by printing the pastes on substrate contact pads. A more fundamental materials and microjoining problem arises from the fact that high density assemblies imply the use of ever smaller solder volumes, and therefore greater emphasis has to placed on the properties of the materials to be joined and especially on their metallurgical compatibility.

Recently, now direct chip attachment and packaging technologies have been developed in order to overcome difficulties produced by higher density joint structures in microelectronics assemblies. For example, "flip chip"-technique is one of the most promising one among the direct chip attachment techniques. Its merits include, for example, area array design and production capabilities, smaller footprint on printed wiring boards, lower cost and better reliability on board level. Area array bumps provide better electrical performance and thermal control by increasing signal propagation rates by shortening signal paths as well as by permitting the employment of available surface mount facilities and assembly lines. On the other hand, presently used direct chip attachment technologies differ significantly from those used in assembling other components, and therefore they increase, in part, the number of different assembly technologies in electronics production.

In general, small metal or alloy bumps are deposited on the contact metallisations of an integrated circuit, most generally using PbSn or PbIn solder alloys, gold or nickel. There can be several hundreds of such 20–50 $\mu$m high bumps in one microcircuit. Material, generally used for bonding, is a paste, which is composed of solder particles and a flux and which has been printed on the contact pads of a substrate. After the alignment procedure the bumps are pressed on the contact pads of the substrate and the assembly is heated over the melting point of solder alloy or, in some cases, over that of solder bumps. While melting the solder alloy or solder bump reacts chemically with the conductor surfaces and generate intermetallic layers, e.g. $Cu_6Sn_5$, $Cu_3Sn$, $Au_2Sn$, $AuSn$ tai $Ni_3Sn_4$, and thus a conventional solder joint is formed. After joining the contact area is generally cleaned from flux residues and shielded against mechanical and chemical influences of the environment, for example, by filling the gap between an integrated circuit and a substrate with a proper protection polymer. As a rule, the solder pastea are heated about 40–50° C. above the melting points of solder alloys. Then the flux removes the oxide layers of the solder paste particles as well as the conductors, protects liquid solder and the surfaces to be joined and thereby permits the formation of joints by metallurgical reactions. The great majority of commercial solders are Sn-based alloys such as Sn37Pb solder, and therefore the reaction products formed in the joint region are some of the above-mentioned intermetallic compounds. This type of soldering technique is viable, when the solder volumes are relatively large and when the flux residues are not harmful for the functional joints or when the cleaning of the residues is technically and economically possible.

Even though the development of direct bonding techniques of integrated circuits and fine-pitch passive components has eliminated some the joining problems, it has revealed new production and commercial problems, which affect the feasibility of the techniques.

A fundamental problem which is due to the increasing density of electrical contacts, is related to the decreasing solder volumes used in microjoints, i.e. amounts of solder alloy per joint or the thickness of solder coatings on conductors. Consequently, the whole solder volume can take part in the chemical reactions between the solder alloy and conductor metallisations. Because of this the compositions and microstructures of solder joints can change even completely from the original microstructure of the solder alloy during the manufacturing and/or in use. These microstructural transformations weaken the mechanical properties of miniaturised and relatively unstable joints. The problem is even pronounced, if lead cannot be used in solder bumps, in metallisations or in solder filler materials in future. With increasing contact densities, i.e. with decreasing contact areas, the washing of flux residues will become more difficult and expensive. Another problem is related to the effects which alternating mechanical stress, humidity or oxygen can have on the properties of ever smaller microjoints.

When finding out solutions to the above-mentioned problems in the assembly of electronic devices, for example, electrically conductive adhesives are being employed more widely. Conductive adhesives are composite materials, which are composed of electrically insulating polymer matrix and more or less uniformly distributed electrically conductive particles; in general silver, graphite, nickel or metal-coated polymer balls. With all the additives or filler materials mentioned the electrical conductivity is based on mechanical contact. Solder alloy particles which melt during the adhesive joining can be used also as filler materials. As a matter of fact, when the adhesive joining and soldering is combined, we may speak about "adhesive soldering". The adhesive itself can be, for example, an epoxy blend or a thin thermoplastic film in which small spherical low-melting solder alloy particles are finely dispersed. The joining of components is carried out by placing such a thin film between the contact pads of components and the substrate and by aligning the contact pads accurately. Temperature is then raised above the melting temperature of metal particles, but, for example, below the curing temperature of an epoxy blend, and the component and substrate are compressed together. Liquid solder particles will flatten and react metallurgically with the mating contact pads producing electrically conductive solder joints between metal particles and contact pads. The polymer locating between the conductors as well as the extruded polymer in the interconductor regions contract and therefore metal particles will experience a compressive stress, which stabilises electrically conductive joints. The composition, size distribution and volume fraction of metal particles dispersed in polymer matrix can alter significantly as it appears for example in the following patents EP 0 147856 A3 and EP 0 265077 A3.

It has been found experimentally that the resistivity values in mechanical joints produced with the solder adhesives and the joining methods based on known technology remain relatively high due to small contact areas and the values increase gradually during long-term high temperature and high humidity testing. This may cause serious functional failures especially in demanding applications.

Although the progress in solder adhesives has removed a significant part of the weaknesses associated with known anisotropically conductive adhesives, there is still a problem, which is difficult to overcome also with solder adhesives. This problem is due to the fact that the areas of contact pads as well as their interdistances are continuously diminishing. Accordingly, uniformly distributed filler particles must also become smaller, if the short-circuits between the neighbouring contact pads are to be avoided. On the other hand, because of electrical conductivity the contact areas must be large enough, which implies relatively large number of solder particles. Smaller average particle sizes and their standard deviations produce difficulties, which are related to the fabrication of alloy powder as well as to the production of soldered microjoints. Another problem is the storage of extreemly small solder particles, so that they could remain relatively unoxidized. If the particles were markedly oxidized their electrical conductivity is decreased and the melting point increased.

The principal object of the present invention is to provide a new fluxless joining method and, related to the method, also an applicable solder adhesive without the drawbacks of the joining methods of the known art. The method can be applied equally well to the assembly of ultra fine-pitch components and substrates as to the joining of components with relatively large contact areas. Furthermore, the electrical, mechanical and chemical properties of high density microjoints produced with the joining method of the present invention are superior to those produced with the joining methods of the known art The joining method permits also more comprehensive usage of different filler materials in adhesives.

The present invention concerning the joining method as well as the solder adhesive are characterised by what is stated in the novelty part of the first and sixth claims, respectively.

In the following the embodiments of the present invention and its benefits in comparison to the joining method of the previous art are described.

The principal object of the present invention is to select the materials becoming into contact with each other in such a way that they are metallurgically as compatible as possible. In other words, they fuse together by mutual dissolution without the formation of any intermetallic compounds. This can be achieved by coating the electrical contact areas of both the component and the substrate with adequately thick base coating layer, for example tin (Sn), and by plating them with thin metallurgically compatible topcoat layers or by using between the base layers a polymer film containing metallurgically compatible solder particles. Both the top coat material as well as solder particles should have adequate solubility and diffusion rate in the base coating, and they should not oxidise too strongly. A metal such as bismuth which dissolves readily into the base coating—for example tin (Sn)—at the joining temperature precipitates as finely dispersed particles during cooling and while diffusing deeper into the base coating with time it will improve the properties of the base coating as microjoining material. Useful solder metals which are compatible with the base coating such as tin (Sn) are, for example, bismuth (Bi) and indium (In) and many of their alloys as well as alloys they form with tin.

In selecting the base and over- or topcoatings it is essential that they do not form intermetallic compounds with each others. With the correct selection of the overcoating material the joining can be performed also under normal atmosphere (in air) and without fluxes. The coating materials such as tin and bismuth melt together transiently at low temperatures; the second melting of the joint region will occur at higher temperatures than the first melting. The thickness of the base coatings of component leads as well as the contact areas of substrate are large enough to prevent the melting of the whole base coatings during the joining operation. This retards effectively the chemical reactions between the solid base metal coating and the underlying conductor metal—being generally copper or nickel. In laboratory tests the thickness of about 10 . . . 50 $\mu$m have been sufficient.

It is also the embodiment of the present invention that before the joining a thin thermosetting or thermoplastic film is placed between the areas to be connected. Moreover, this can be realised when solder metal or alloy is not in form of particles but it has been brought into the contact areas by plating one or both of the base coatings chemically or electrochemically with a thin layer of the corresponding solder metal, most preferably with pure bismuth or tin-bismuth alloy. The thickness of the top coat is generally in the range of 1–3 $\mu$m. The adhesive which is extruded during the joining into the spaces between tin-coated contact areas isolates the joints mechanically, insulates electrically and protects the joints from external oxygen and moisture. Moreover, it enhances the joints to tolerate better cyclic thermal strains.

The fabrication of microjoints produced according to the fundamental idea of the present invention is based on the formation of solid solution or of solid solution containing finely dispersed precipitates, and it can be realised in the two different ways:

Before the heating the contact areas to be joined have been plated with the base coating—for example tin—and subsequently with a thin metallurgically compatible over—or topcoat layer—for example bismuth—which dissolves rapidly into the tin coatings, when the contact region is heated up to the bonding temperature, say 180° C. The metal producing the interfusion can be brought between the base metal coated contact areas also in the form of metallurgically compatible particles with help of polymer matrix.

The temperature of joining depends in each case on the combination of metals used. Due to the small thickness of topcoat layer or small volumes of the particles the dissolution and subsequent melting and solidification of the joint regions occur rapidly. Because of the mutual dissolution of thin topcoat layers—or particles—and the base coatings the melting temperature of the dissolution affected contact region decreases rapidly much below those of the original materials now participating the joints and thus a thin liquid layer is formed in the contact region.

The melting temperature of tin is 232° C. and that of bismuth is 271° C., while the lowest melting point of thin Sn—Bi-containing liquid layer 139° C. Thus, using the bismuth topcoat layer or Bi particles together with the tin base coating the joining temperature is somewhat above 139° C., e.g. in the range of 160–180° C. Since the tin base coating is plated chemically or electrochemically with bismuth, there is fully metallic interface between the two coatings and this enhances the melting of the contact region. While bismuth is diffusing from thin topcoat layers deeper into the tin coating its concentration decreases rapidly in the thin liquid layer and therefore the melting point of the liquid increases with the result that the liquid region can solidify partly or completely already at the joining temperature.

Driven by its concentration gradient bismuth diffuses in solid state further away from the original contact interface and the supersaturated part of dissolved bismuth precipitates during cooling or subsequently at room temperature as finely dispersed bismuth precipitates in ductile tin matrix. This will increase the strength of microjoints without reducing significantly the toughness of tin-rich solid solution. It should be noticed that the melting point of the Bi-depleted joint region is raised irreversibly close to the melting point of pure tin. Consequently, the operational temperatures can be markedly above the temperatures of joining. The fact that bismuth is only weakly oxidising, relatively noble semimetal, permits the joining without any flux.

It is also according to the present invention that the joining is accomplished by using between the tin base coatings the alloy—either as a topcoat or in a form of particles—whose melting temperature is without any diffusion contact already below the joining temperature—as is the case with the tin base coatings and the SnBi-, SnIn- or BiIn-alloy top coatings. In such a case a thin solder alloy layer between the contact surfaces melts already during the heating and the liquid layer dissolves a thin layer of solid tin base coatings. For example, in,the case of the SnBi overcoat bismuth atoms diffuse rapidly from the liquid deeper into the solid tin coatings of both contact areas. Accordingly, the liquidus temperature of the contact region increases and the liquid can solidify partly or completely already at the joining temperature or during the subsequent cooling. Also in this alternative the melting point of the contact region is raised irreversibly close to that of tin.

In the case of overcoatings which oxidize stronger than bismuth it is preferable to plate the overcoat still with a very thin noble metal layer, for example with gold or silver and/or locate a thin thermosetting or thermoplastic polymer film between the mating contact areas of component and substrate. The polymer foil distributes also stress more uniformly over the joint region and protects from the effect of humidity. Since the contact surfaces are heated above the melting temperature of solder alloy during the joining the polymer can remove some of the oxide layers while flowing away from the contact region.

Figure 1B:
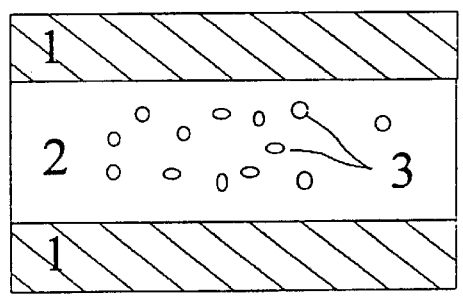
Figure 2:
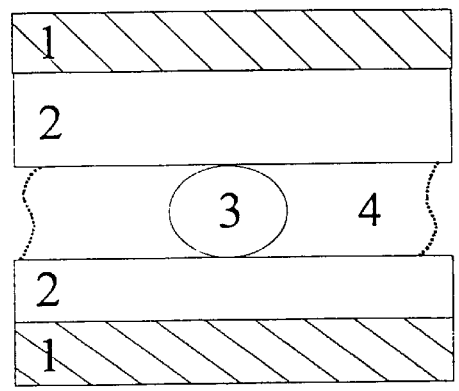
Figure 2:
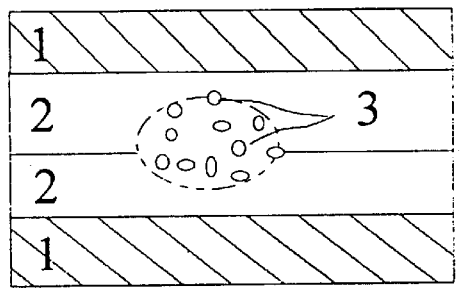
Figure 3:
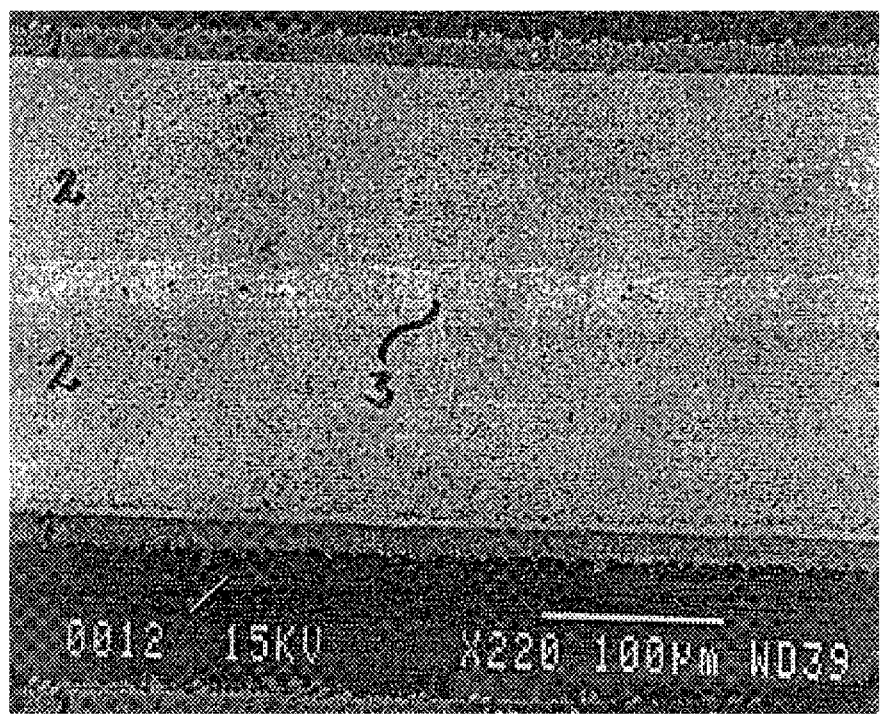
Figure 3:
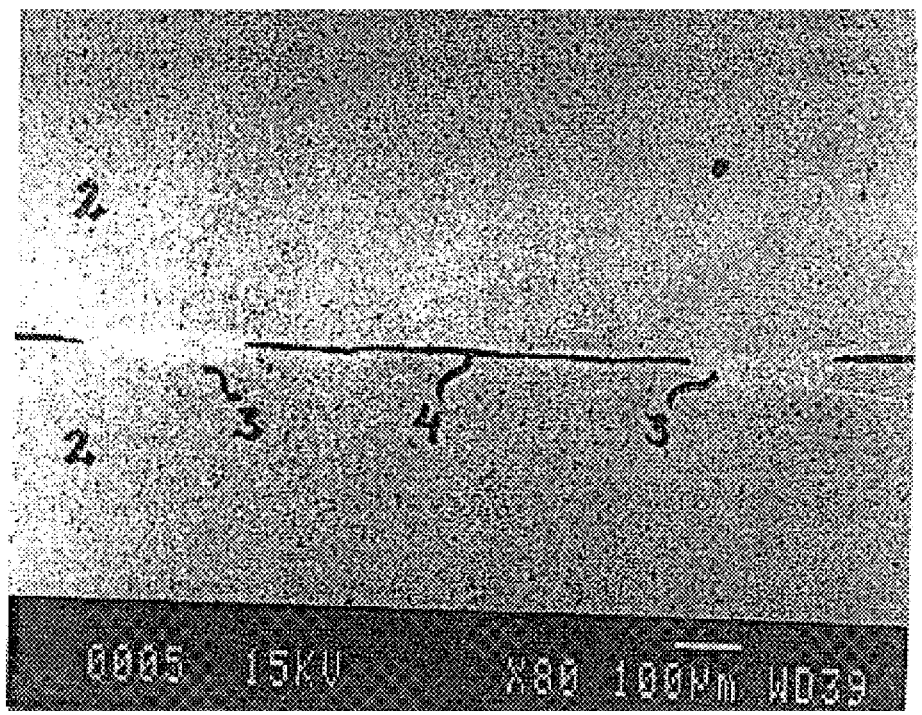

The benefits of the present invention in this application are presented by referring to FIGS. 1, 2 and 3. FIG. 1(a) shows schematically the case where the conductors (1) are firstly plated with the base metal or alloy coating (2) and subsequently a thin metallurgically compatible layer of metal (3) is deposited on the base coating. When the conductors coated with above-mentioned layers are compressed together at an elevated temperature the coatings fuse together without forming intermetallic compounds between the conductors, as shown in FIG. 1(b). When using, for example, tin as the base coating together with metallurgically compatible top coat metal, say bismuth, there is no intermetallic reactions between these two pairs of metals. Instead, bismuth dissolves into tin and precipitates during the cooling or after as very fine particles when the solubility limit of bismuth is exceeded, as shown in FIG. 1(b).

FIG. 2 presents the case where the conductors (1) plated with the base coating (2) are joined with polymer (4) containing metallurgically compatible solder particles (3). FIG. 2(a) and FIG. 2(b) illustrate the situation before and after the joining, respectively. In FIG. 2(b) a solder particle has dissolved into the base coating (2) and precipitated there as finely dispersed particles during the cooling or after.

FIG. 3(a) shows a scanning electron microscope image of a solder joint which has been produced without flux in air. In this case tin-coated (2) copper conductors (1) have been plated with a very thin layer of pure bismuth and then lightly pressed together and heated up to the temperature of 180° C. for 10 seconds in air and without any flux. Accordingly, the intermixing of tin and bismuth gives rise to the seamless interfusion of the coated conductors and the bismuth exceeding the solubility limit has precipitated in the joint region (3).

Correspondingly, FIG. 3(b) shows a scanning electron microscope image taken from the joint region, where Bi-particles (3) have melted between the tin coatings (2) and the bismuth which has dissolved during the joining have precipitated from the tin-rich (Sn,Bi)-solution of the joint region (3).

Studies which have been performed with joints like those shown previously have pointed out that with refined microstructure better mechanical and electrical properties of the joints can be obtained and that the properties ar better than those achieved with the methods of the known art. This type of microstructure gives the best mechanical response against external loadings.

One embodiment of the present invention is also that fine particles, for example Bi (FIGS. 1, 2 and 3), disperse with time over larger volumes of the base coatings, e.g. tin, and therefore the joint region is gradually changing into practically pure tin. The rate of Bi diffusion over the whole of the base coatings can be increased by separate annealing treatment.

The joining method of the present invention is easy to use. It does not imply the application of flux, and thus the joints need no cleaning. Furthermore, since the method is lead-free, it is environmental-friendly also from that point of view.

What is claimed is:

1. A method of joining electronic components, comprising the steps of:

coating surfaces of the electronic components to be connected with metal or metal-alloy contact layers;

placing between the contact layers a polymer film containing metal or metal-alloy filler particles, wherein the contact layers and the filler particles do not form intermetallic compounds and wherein the contact layers and the filler particles at their contact interface have a melting temperature lower than the melting temperature of the contact layers or the filler particles; and placing the contact layers and the polymer film in contact and heating them to the melting temperature of their contact interface.

2. A method as defined in claim 1, wherein said contact layers comprise tin and said filler particles comprise bismuth.

3. A method as defined in claim 1, wherein said contact layers comprise tin and said filler particles comprise tin-bismuth.

4. A method as defined in claim 1, wherein said contact layers comprise tin-indium and said filler particles comprise bismuth.

5. A method as defined in claim 1, wherein said contact layers comprise tin-indium and said filler particles comprise tin-bismuth.

6. A method a defined in claim 1, wherein said contact layers are produced by electrochemical or chemical deposition.

* * * * *